US006472886B2

(12) United States Patent
Lee

(10) Patent No.: US 6,472,886 B2
(45) Date of Patent: Oct. 29, 2002

(54) METHOD OF CALCULATING PARASITIC CAPACITANCE BETWEEN ELECTRODES OF INTEGRATED CIRCUITS

(75) Inventor: Keun-ho Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/814,376

(22) Filed: Mar. 21, 2001

(65) Prior Publication Data

US 2001/0033172 A1 Oct. 25, 2001

(30) Foreign Application Priority Data

Mar. 21, 2000 (KR) .............................................. 00-14261

(51) Int. Cl.$^7$ .............................................. G01R 27/26
(52) U.S. Cl. ........................................ 324/659; 324/601
(58) Field of Search .......................... 361/280; 324/601, 324/677, 659

(56) References Cited

U.S. PATENT DOCUMENTS 6,327,545 B1 * 12/2001 Browen ........................ 324/601
2002/0036508 A1 * 3/2002 Komoda ...................... 324/677

* cited by examiner

*Primary Examiner*—Christine K. Oda
(74) *Attorney, Agent, or Firm*—F. Chau & Associates, LLP

(57) ABSTRACT

A method of calculating capacitance between conductive patterns of an integrated circuit (IC) by defining a mesh of nodes in a space between at least two electrodes, calculating the electric potential at each node, and then calculating the parasitic capacitance between the electrodes.

13 Claims, 4 Drawing Sheets

METHOD OF CALCULATING PARASITIC CAPACITANCE BETWEEN ELECTRODES OF INTEGRATED CIRCUITS

BACKGROUND OF THE INVENTION

1. Field of the Invention

The present invention relates to an integrated circuit (IC), and more particularly to a method of calculating parasitic capacitances and their effects on floating conductive patterns used in ICs.

2. Description of the Related Art

Many insulating layers and conductive patterns are stacked on a substrate, realizing an integrated circuit (IC). However, as the IC becomes more highly-integrated, vertical and horizontal intervals between interconnections (electrodes) become narrower. The effects of parasitic capacitances between the narrower interconnections become more pronounced. Parasitic capacitances can cause is undesirable effects such as signal delay and crosstalk. Therefore, the existence of parasitic capacitances must be anticipated and it is common practice to calculate the parasitic capacitance when designing ICs.

Poisson's equation, expressed as in Equation 1, is commonly used in the calculation of parasitic capacitance:

$$G^2 \phi = P$$

where $\phi$ is the potential function at a predetermined position, and p is a function or constant that is pre-assigned according to the problem to be solved. The potential $\phi$, is obtained by solving Poisson's equation in Equation 1 and the capacitance C is obtained by Equation 2a and 2b.

$$C = \frac{Q}{V} \quad (2a)$$

$$Q = \int \vec{E} \cdot dS = \int \nabla_\phi \cdot dS \quad (2b)$$

where Q is charge, V is voltage, $\vec{E}$ is the electric field, [and S is distance?].

Here, boundary conditions are usually required to solve Poisson's equation. In IC manufacture, boundary conditions are usually set with the Dirichlet condition for designating a potential value at a predetermined node and the Neumann condition for designating a gradient value of the potential at a predetermined node.

Another factor to consider is that dummy conductive pattern, having no electrical role, are often added to ICs for any number of reasons. For example, in the process of fabricating an IC there may be a dummy pattern for compensating for a step difference formed on a portion of an IC chip, or for preventing a dishing phenomenon in which the insulating layer becomes dented where the patterns are sparse, such as during the planarizing of an insulating layer in a chemical mechanical polishing (CMP) process. In general, a voltage is not applied to these dummy conductive patterns, and they remain in an electrically isolated state, that is, in a floating state. Often, separate interconnections are provided to apply a voltage to the dummy conductive patterns or to ground them, thereby contributing further to the overall parasitic capacitance. Similarity, a floating gate of a non-volatile memory device is another example of a floating conductive pattern, even if the floating gate is not a dummy gate.

Because floating conductive patterns contribute to parasitic capacitance between interconnections, they are commonly included in calculations of parasitic capacitance. However, for the floating conductive patterns, it is not possible to set up the Dirichlet condition or Neumann condition as the boundary conditions for solving Poisson's equation, unless interconnections are provided to ground or apply voltage to them. In such cases, it is common to use either an "equivalent circuit" method or a "charge boundary" method. An equivalent circuit method obtains the capacitance by assuming the floating conductive patterns as the electrically connected interconnections, in which the Dirichlet conditions can be set up. A charge boundary method obtains the potential by non-linear iteration by setting-up an arbitrary charge condition on the floating conductive patterns.

However, the calculation of capacitance by the equivalent circuit and charge boundary methods as applied to floating conductive patters is more complicated and requires more time than the calculation of the capacitance between actual interconnections (electrodes).

It would therefore be desirable to provide a method of calculating parasitic capacitance that requires less computing time than the traditional equivalent circuit and charge boundary methods, particularly in situations where floating conductive patterns are present.

SUMMARY OF THE INVENTION

Disclosed herein is a method of calculating capacitance between conductive patterns of an integrated circuit (IC) comprising defining a mesh of nodes in a space between at least two electrodes, calculating the electric potential at each said node, and calculating the parasitic capacitance between said electrodes.

The method preferably further comprising one or more floating conductive patterns between said electrodes and wherein a set of surface nodes is defined upon the outer surface of each said floating conductive pattern. The surface nodes are mathematically treated as a single merged node for each said floating conductive pattern, wherein said electric potentials are calculated by a linear equation of the form:

$$\overline{A}\vec{\phi} = \vec{b}$$

where $\vec{\phi}$ is a potential vector of N potentials corresponding to each of N said nodes in said mesh; $\overline{A}$ is the matrix of coupling coefficients between said nodes, and $\vec{b}$ is a vector of known constant or function.

According to an of the present invention, a recording medium, is provided for storing a program executable by computer for calculating parasitic capacitance between conductive patterns of an integrated circuit (IC) having two electrodes, the program comprising: a module for defining a mesh of nodes in a space between said electrodes; a module for calculating the electric potential at each said node; and a module for calculating the parasitic capacitance between said electrodes from said electric potential.

Preferably, the recording medium further includes a module for merging surface nodes of floating conductive patters into a single merged node for each said floating conductive pattern by using an equivalent potential condition at the surfaces of the floating conductive patters, wherein said module for calculating electric potential utilizes a linear matrix equation of the form:

$$\overline{A}\vec{\phi} = \vec{b}$$

where $\vec{\phi}$ is a potential vector of N potentials corresponding to each of N said nodes in said mesh; $\overline{A}$ is the matrix of coupling coefficients between said nodes, and $\vec{b}$ is a vector of known constant or function.

DETAILED DESCRIPTION OF PREFERRED EMBODIMENT OF THE INVENTION

Figure 1:
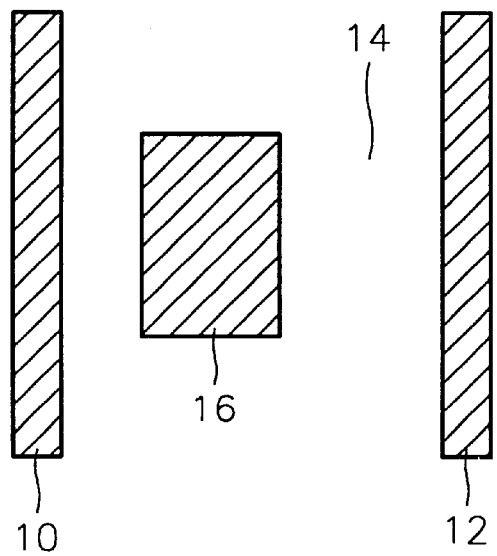
FIG. 1 is a sectional layout diagram of an integrated circuit (IC) having floating conductive patterns between two interconnections, in which the parasitic capacitance is calculated.

Referring to FIG. 1, there is shown a simple IC configuration comprising a capacitance having three conductive patterns: a first interconnection 10 a second interconnection and 12, and one floating conductive pattern 16 there between in a two-dimensional space. The interconnections 10, 12 and floating conductive patter 16 are electrically isolated by an insulating layer 14. Note that the term "electrode" is meant a conductive pattern that is not floating, but rather is grounded or connected to a potential. We first examine how to calculate the parasitic capacitance using traditional equivalent circuit and charge boundary methods.

Equivalent Circuit Method

Figure 2A:
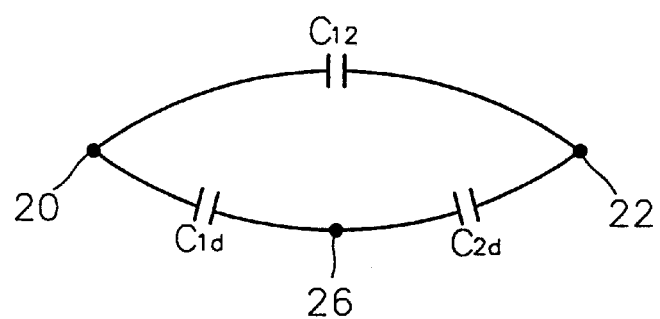
FIG. 2A is an equivalent circuit diagram illustrating capacitance of the IC shown in FIG. 1.
Figure 2B:
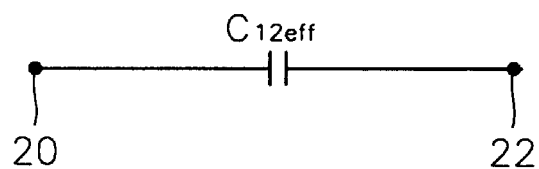
FIG. 2B is an equivalent circuit diagram illustrating the capacitance of the circuit shown in FIG. 2A as one equivalent capacitance.

Referring to FIGS. 1 through 2B, in the equivalent circuit method the floating conductive pattern 16 is treated as an actual electrode that is not electrically isolated. This is illustrated as an equivalent circuit, as shown in FIG. 2A. In FIG. 2A, the three conductive patterns are represented as nodes. A first node 20, a second node 22, and a third node 26 represent the first interconnection 10, the second interconnection 12, and the floating conductive pattern 16 of FIG. 1, respectively. Here, the capacitance $C_{12}$ between the first node 20 and the third node 26 is treated as though a voltage of 1V is applied to the first node 20, and 0V to the second node 22. The capacitance $C_{12}$ is then calculated using Equations 2a and 2b after a potential is obtained by solving Poisson's equation (Equation 1). Capacitances $C_{1d}$ and $C_{2d}$ are obtained by the same method.

Referring to FIG. 2B, an equivalent circuit is shown that now considers the floating nature of the conductive pattern 16. An equivalent capacitance $C_{12eff}$ between the first interconnection 10 and the second interconnection 12 of FIG. 1 is expressed using Equation 3:

$$C_{12eff} = C_{12} + \frac{C_{1d}C_{2d}}{C_{1d} + C_{2d}} \quad (3)$$

Equation 3 appears to be relatively simple but the second term of Equation 3 quickly becomes complicated when the number of floating conductive patterns 16 is increased, and thus, calculation time is suddenly increased. The time required to calculate the capacitance considering the floating conductive patterns 16 by the equivalent circuit method is tabulated below for thirty conductive patterns 16.

TABLE 1

| | Number of electrodes | Number of floating conductive patterns | Number of target electrodes | Time required to calculate capacitance (seconds) |
|---|---|---|---|---|
| When all floating conductive patterns are grounded | 33 | 0 | 2 | 379 |
| When the floating conductive pattern is in a floating state | 3 | 30 | 2 | 5519 |

A simulation used in the calculation of the capacitance shown in Table 1 was performed in three-dimensional (3-D) space with respect to an electrode structure having an insulating layer on a substrate and thirty floating conductive patterns between the two interconnections, actual electrodes. Three actual electrodes were utilized, including the substrate and two interconnections. The simulation was run using the software RAPHAEL, a commercial capacitance-calculation program published by Avanti, employing the equivalent circuit method. The time required to calculate the capacitance in Table 1 was the CPU run time when the software was run on a Hewlett-Packard HP735 workstation computer.

From Table 1, when all floating conductive patterns are grounded, the time required to calculate the capacitance is not long, but when the floating conductive patterns are in a floating state, the time required to calculate the capacitance is suddenly increased.

Charge Boundary Method

In the charge boundary method, a total charge applied to the surfaces of the floating conductive patterns is set up as an arbitrary value and a check is performed to determine whether the value satisfies several non-linear equations including Poisson's equation (Equation 1). If satisfied, the capacitance is obtained from the total charge. If not satisfied, the capacitance is obtained by repeating the step of checking whether the value altogether satisfies these equations changing the set-up total charge.

Accordingly, in the charge boundary method, the calculation time does not usually drastically increase even if the number of floating conductive patterns is increased. However, because a non-linear repetition method such as a Newton iteration is required, the method of calculating the capacitance is very complicated cumbersome to realize in software.

Figure 3:
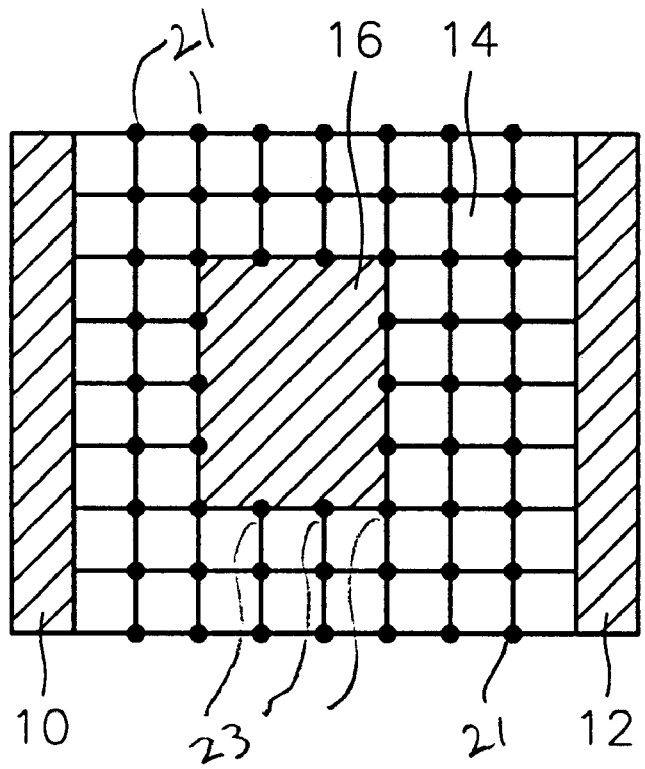
FIG. 3 illustrates a step of dividing an electrode structure into a finite mesh and defining nodes according to the method of the present invention so as to calculate the parasitic capacitance between interconnections of the IC of FIG. 1.

Referring to FIG. 3, according to an embodiment of the invention there is shown a layout including a first and second interconnections 10 and 12, a floating conductive pattern 16, and an insulating layer 14 is divided into a finite mesh nodes 21. The interval of the mesh is shown larger than might usually be used for the convenience of the reader. The nodes 21 are also shown divided into equal intervals, but it is possible for the size or the division interval of the mesh to be adjusted for accuracy of calculation as needed.

The potential at each node 21 is calculated by solving Poisson's equation (Equation 1) at each position. There are no nodes inside the floating conductive pattern 16, potentials on the surfaces of any conductive pattern are identical. In the embodiment of the present invention, unlike the above-mentioned equivalent circuit method and charge boundary method, surface nodes 23 on the surface of the floating conductive pattern 16 are treated like nodes of a region of the insulating layer 14. Recall That in the equivalent circuit and charge boundary methods, boundary conditions (a Dirichlet condition in the equivalent circuit method and a total charge condition in the charge boundary method) are set up on the surface of the floating conductive pattern 16, and the potential is predetermined, In the embodiment of the present invention, the surface of the floating conductive pattern 16 is an unknown quantity, in which the potential is not determined, and this means that Poisson's equation must be solved on the surface. The surface of the floating conductive pattern 16 is not a "boundary", so boundary conditions are not set up. Poisson's Equation is therefore solved by an alternative means as set forth below.

Referring again to FIG. 3, Poisson's equation at all nodes 21, 23, may be expressed by a linear matrix equation, $$\overline{A}\vec{\phi} = \vec{b}$$

where $\overline{A}$ is a matrix of N rows and N columns (N is the number of the nodes 21, 23 and is equal to fifty-seven in FIG. 3), and $\vec{\phi}$ is a potential vector, and $\vec{b}$ is a vector of a known constant or function, often related to the geometry of the nodes. Accordingly, Equation 4 can be expressed as Equation 5.

$$\begin{pmatrix} d_1 & x_1 & & y_1 & & & & & \\ x_1 & d_2 & x_2 & & y_2 & & & & \\ & x_2 & d_3 & \cdot & & \cdot & & & \\ & & \cdot & \cdot & \cdot & & \cdot & & \\ & & & \cdot & \cdot & \cdot & & \cdot & \\ & & & & \cdot & \cdot & \cdot & & y_j \\ y_1 & & & & & \cdot & \cdot & \cdot & \\ & y_2 & & & & & \cdot & \cdot & \cdot \\ & & \cdot & & & & & \cdot & \cdot & \cdot \\ & & & \cdot & & & & & \cdot & \cdot & x_i \\ & & & & y_j & & & & x_i & d_N \end{pmatrix} \begin{pmatrix} \phi_1 \\ \phi_2 \\ \cdot \\ \cdot \\ \cdot \\ \cdot \\ \cdot \\ \cdot \\ \cdot \\ \cdot \\ \phi_N \end{pmatrix} = \begin{pmatrix} b_1 \\ b_2 \\ \cdot \\ \cdot \\ \cdot \\ \cdot \\ \cdot \\ \cdot \\ \cdot \\ \cdot \\ b_N \end{pmatrix}$$

where N is the total number of nodes, $d_i$ is the sum of coupling coefficients with nodes adjacent to each node, and $x_i$ and $y_i$ are coupling coefficients in x and y directions, respectively. Also, all blanks without any indications in the matrix $\overline{A}$ are filled with O's. Meanwhile, the structure shown in FIG. 3 is a two-dimensional structure, and the matrix $\overline{A}$ is also a matrix when the potential is calculated in two-dimensional space. Accordingly, in order to obtain the potential in an actual three-dimensional space, a coupling coefficient $Z_i$ in a z-direction is further contained in the matrix $\overline{A}$.

Figure 4:
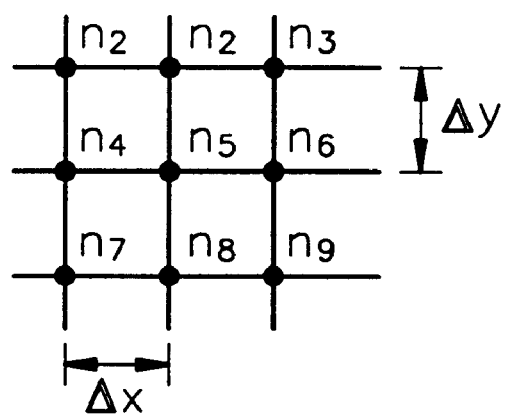
FIG. 4 illustrates coupling coefficients at each node.

In detail, $d_i$, $x_i$, and $y_i$ are obtained as below. For example, as shown in FIG. 4, assuming that there are nine nodes in total, the equation corresponding to Poisson's equation at the fifth node $n_5$ is expressed by Equation 6.

$$a_x(\phi_5-\phi_4)+a_x(\phi_5-\phi_6)+a_y(\phi_5-\phi_2)+a_y(\phi_5-\phi_8)=0 \quad (6a)$$

$$-a_y\phi_2-a_x\phi_4+2(a_x+a_y)\phi_5-a_x\phi_6-a_y\phi_8=0 \quad (6b)$$

where, $a_x$ and $a_y$ are coefficients, which correspond to $$\frac{\partial^2}{\partial x^2} \text{ and } \frac{\partial^2}{\partial y^2}$$

related to distances $\Delta x$ and $\Delta y$ between the nodes in the x- and y-directions, respectively. Accordingly, the fifth row vector of the matrix $\overline{A}$ is like (0, $-a_y$, 0, $-a_x$, $2(a_x+a_y)$, $-a_x$, 0, $-a_y$, 0). That is, $y_2=-a_y$, $x_4=-a_x$, $d_5=2(a_x+a_y)$, $x_6=-a_x$, $y_8=-a_y$.

The potential vector $\vec{\phi}$ is derived by solving the linear matrix equation of Equation 4. In other words, the potential vector $\vec{\phi}$ is expressed by Equation 7.

$$\overline{A}\vec{\phi} = \vec{b} \quad (7)$$

Accordingly, in contrast to the equivalent circuit method, where the amount of calculation rapidly increases according to the number of floating conductive patterns, or the charge boundary method requiring the non-linear repetition, in the method of the invention, the potential vector may be directly obtained by the step of solving the linear matrix equation at one time, regardless of the number of the floating conductive patterns.

The finite mesh of nodes 21, 23 of FIG. 3 may be further simplified by taking advantage of the fact that potentials are identical on the surfaces of the conductor. Applying this principle to the floating conductive patterns 16, an equivalent potential condition wherein the potentials at the surface nodes 23 are identical may be described as:

$$\phi_{16}=\phi_{17}=\cdots=\phi_{41} \quad (8)$$

Figure 5:
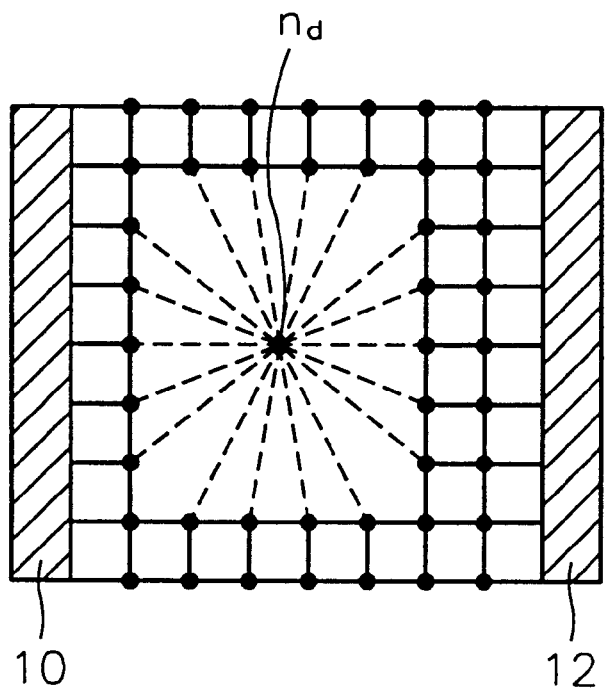
FIG. 5 illustrates;a step of merging surface nodes of the floating conductive patterns among the nodes shown in FIG. 3 into one node.

Referring to FIG. 5, and finite mesh of FIG. 3 may be simplified wherein the surface nodes of the floating conductive pattern 16 may be expressed as a single node $n_d$. Equation 5 may then be simplified by reducing the number of rows and columns follows:

$$\begin{pmatrix} d_1 & x_1 & & y_1 & & & & & & \\ x_1 & d_2 & x_2 & & y_2 & & f_1 & & & \\ & x_2 & d_3 & \cdot & & \cdot & f_2 & & & \\ & & \cdot & \cdot & \cdot & & \cdot & & & \\ & & & \cdot & \cdot & \cdot & & \cdot & \cdot & \\ y_1 & & & \cdot & \cdot & \cdot & & \cdot & & y_l \\ & y_2 & & & \cdot & \cdot & \cdot & & & \\ & & \cdot & & & \cdot & \cdot & \cdot & & \\ & f_1 & f_2 & \cdot & \cdot & & \cdot & d_i & \cdot & f_p \\ & & & & & & & \cdot & \cdot & \cdot & x_k \\ & & & & y_l & & & f_p & x_k & d_M \end{pmatrix} \begin{pmatrix} \phi_1 \\ \phi_2 \\ \cdot \\ \cdot \\ \cdot \\ \cdot \\ \cdot \\ \cdot \\ \cdot \\ \cdot \\ \phi_M \end{pmatrix} = \begin{pmatrix} b_1 \\ b_2 \\ \cdot \\ \cdot \\ \cdot \\ \cdot \\ \cdot \\ \cdot \\ \cdot \\ \cdot \\ b_M \end{pmatrix}$$

where M is the total number of nodes of FIG. 5 and $f_i$ is a coupling coefficient between the surface nodes and the merged node $n_d$, as represented by the dotted lines in FIG. 5. M is less than N in Equation 5 because the surface nodes of the floating conductive pattern 16 are merged into node $n_d$.

By this method, the capacitance between the first 10 and second 12 interconnections is calculated, taking into account the effect of the floating conductive patterns while avoiding direct calculation of the capacitance with respect to the floating conductive patterns.

The illustrative calculation method of the invention may be realized by a program executed by a computer and the program may be provided by computer readable media. The media can include storage media such as magnetic media (for example, a read-only memory (ROM), a floppy disk, and a hard disk), optical media (for example, a CD-ROM and a digital video-disc (DVD)), and carrier waves (for example, transmission via the Internet).

Figure 7A:
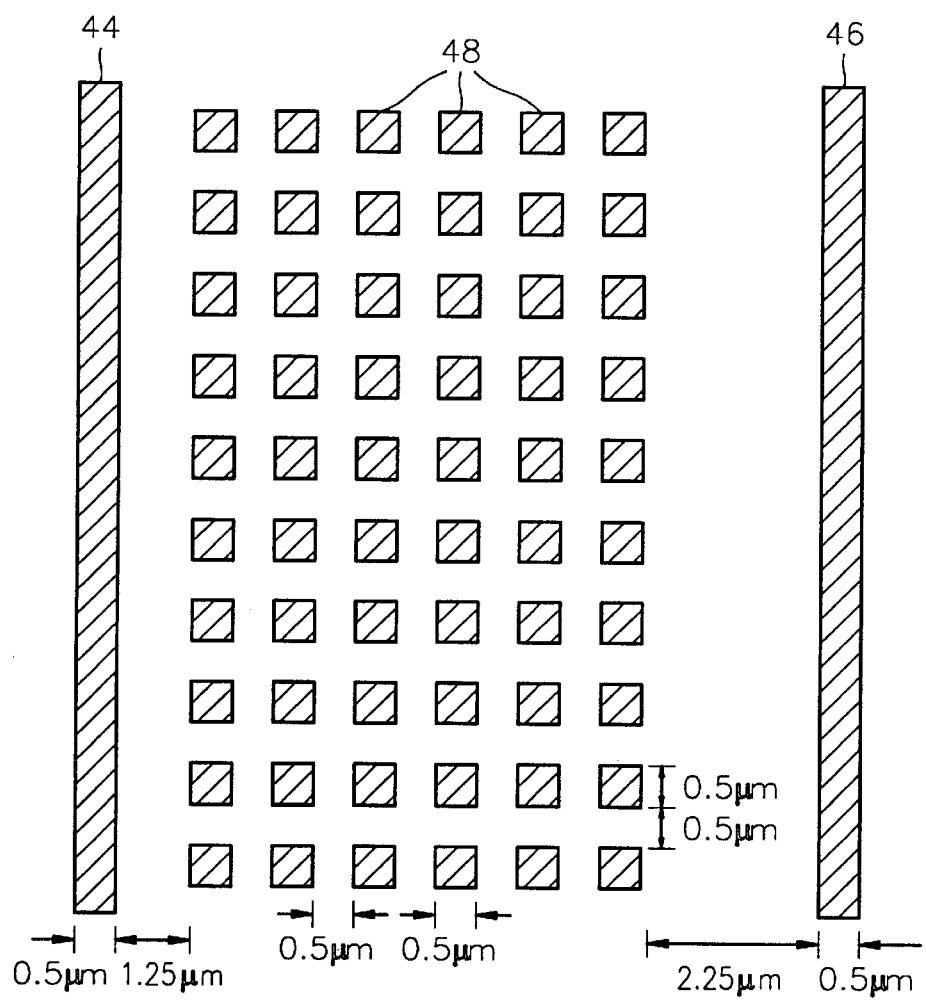
FIGS. 7A and 7B are layout diagrams and sectional views of the IC used in another embodiment of calculating the parasitic capacitance between interconnections according to the conventional method and the method of the present invention.

In general, the structure of interconnections (electrodes) including floating conductive patterns, as shown in FIG. 1 or FIG. 7A, is converted into layout data to fabricate a photomask and stored. Thus, the illustrative process of the present invention can be programmed by using the layout data. The recording medium, or media would comprise module for dividing an electrode structure having the electrodes, the insulating layer, and the floating conductive patterns into a finite mesh, and for defining nodes, in which a potential is calculated; a module for dividing and electrode structure comprising one or more electrodes, insulating layers, and floating conductive patters into a mesh nodes; a module for obtaining the parasitic capacitance between the electrodes from the potential vector.

Here, codes and code segments of a functional program, in which each program module is actually coded, can be easily inferred and made by a skilled computer programmer in the art.

Figure 6:
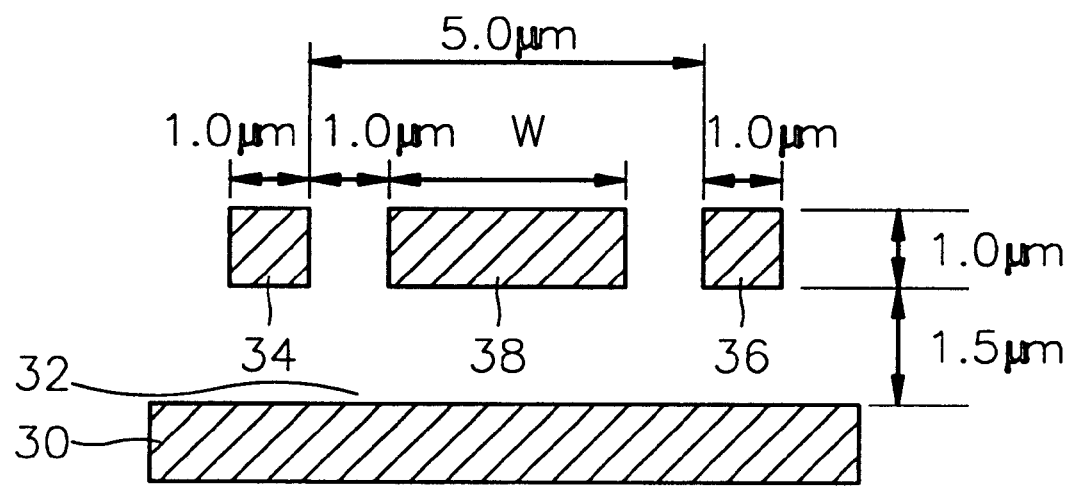
FIG. 6 is a sectional view of the IC used in an embodiment of calculating the parasitic capacitance between the interconnections according to the conventional method and the method of the present invention.

The method of the present invention was implemented and the results compared to a simulation of the equivalent circuit method as applied to the structure of FIG. 6. The RAPHAEL software package published by Avanti was used for the equivalent circuit method, executed on a Hewlett-Packard HP375 workstation.

Referring to FIG. 6, an electrode structure comprising an insulating layer 32 is on a substrate 30, and one floating conductive pattern 38 is between two interconnections 34 and 36. The dielectric constant of the insulating layer 32 is 3.9. The result of the calculations is shown in Table 2.

TABLE 2

|  | Capacitance between two interconnections (fF) | | Number of potential calculations |
|---|---|---|---|
|  | w = 2.5 μm | w = 3.5 μm |  |
| Method of the present invention | 0.0256 | 0.0413 | 1 |
| Equivalent circuit method | 0.0259 | 0.0415 | 2 |
| Change (%) | 1.2 | 0.5 |  |

From Table 2, it will be understood that the capacitances calculated by the method of the present invention and equivalent circuit method are substantially identical. However, from an aspect of the number of potential calculations, in the case of the equivalent circuit method, at least two potentials must be calculated and, if the number floating conductive pattern are increased, the number of potentials to be calculated is drastically increases. However, in the case of the method of the present invention, the capacitance can be calculated with one calculation regardless of the number of floating conductive patterns. In structures having many floating conductive patterns where the capacitance must be calculated in three-dimensional space, the difference in the number of the calculations and time required to calculate the capacitance of the present invention in comparison to the prior are is more pronounced.

Figure 7B:
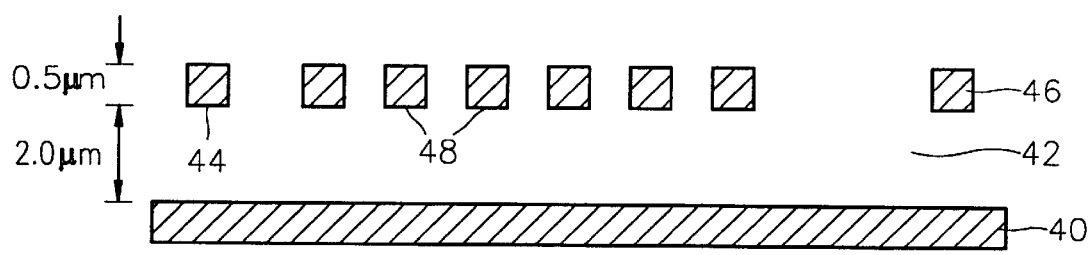

By example, the calculation result of the capacitance in three-dimensional space, as applied to the structure illustrated in FIGS. 7A and 7B is shown in Table 3. In FIGS. 7A and 7B, there is shown a substrate 40, an insulating layer 42, a first interconnection 44, a second interconnection 46, and a plurality of floating conductive patterns 48. The dielectric constant of the insulating layer 42 is 3.9.

TABLE 3

|  | Capacitance (fF) | | Time required to calculating capacitance (seconds) |
|---|---|---|---|
|  | $C_{1tot}$ | $C_{12eff}$ |  |
| Method of the present invention | 0.714 | 0.045 | 874 |
| Equivalent circuit method | 0.721 | 0.046 | 25146 |
| Change (%) | 1.0 | 2.2 |  |

Here, $C_{12eff}$ is an equivalent capacitance considering the floating conductive patterns 48 between the first interconnection 44 and the second interconnection 46, and $C_{1tot}$ is the sum of $C_{12eff}$ as a total capacitance at the first interconnection 44, a capacitance between the first interconnection 44 and the floating conductive patterns 48, and an overlap capacitance between the first interconnection 44 and the substrate 40. As is evident from Table 3, there is little difference in the accuracy of the calculated capacitance between the method of the invention and the equivalent circuit method, but there is a large difference in the time required for calculation between the two methods. As described above, according to the present invention, in the calculation of the parasitic capacitance between the electrodes (interconnections), tasking into account the effect of floating conductive patterns, the parasitic capacitance may be expressed as one linear matrix equation in which it is not necessary for boundary conditions to be applied to the surface of the floating conductive patterns Calculation time and complexity are thereby dramatically reduced as compared to traditional calculation methods.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about, or like, is not be construed as an explicit indication that any such disclosed physical quantity is an exact quantity, irrespective of where such qualifiers are used with respect to any other physical quantities disclosed herein.

While preferred embodiments have been shown and described, various modifications and substitutions may be thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of calculating capacitance between conductive patterns of an integrated circuit (IC) comprising:
   defining a mesh of nodes in space between at least two electrodes;
   calculating the electric potential at each said node; and
   calculating the parasitic capacitance between said electrodes from said electric potentials.

2. The method of claim 1 further comprising one or more floating conductive patterns between said electrodes and wherein a set of surface nodes is defined upon the outer surface of each said floating conductive pattern.

3. The method of claim 2 wherein said surface nodes are mathematically treated as a single merged node of each said floating conductive pattern.

4. The method of claim 1 wherein said electric potentials are calculated by a linear equation of the form:

$$\overline{A}\vec{\phi}=\vec{b}$$

where $\vec{\phi}$ is a potential vector of N potentials corresponding to each of N said nodes in said mesh; $\overline{A}$ is the matrix of coupling coefficients between said nodes, and $\vec{b}$ is a vector of known constant or function.

5. The method of claim 3 wherein said electric potentials are calculated by a linear equation of the form:

$$\overline{A}\vec{\phi}=\vec{b}$$

where $\vec{\phi}$ is a potential vector of M potentials corresponding to each of said nodes in said mesh that are not surface nodes and to each said merged node corresponding to said surface nodes of each said floating conductive pattern; $\overline{A}$ is the matrix of coupling coefficients between said nodes, and $\vec{b}$ is a vector of known constant or function.

6. A recording medium, for storing program executable by a computer for calculating parasitic capacitance between conductive patterns of a integrated circuit (IC) having at least two electrodes, comprising:

a module for defining a mesh of nodes in a space between said electrodes;

a module for calculating the electric potential at each said node; and a module for calculating the parasitic capacitance between said electrodes from said electric potentials.

7. The recording medium of claim 6, where the recording medium further includes a module for merging surface nodes of floating conductive patterns into a single merged node for each said floating conductive pattern by using an equivalent potential condition at the surface of the floating conductive patterns.

8. The recording medium of claim 6, wherein said module for calculating electric potential utilized a linear matrix equation of the form:

$$\overline{A}\vec{\phi}=\vec{b}$$

where $\vec{\phi}$ is a potential vector of N potentials corresponding to each of N said nodes in said mesh; $\overline{A}$ is the matrix of coupling coefficients between said nodes, and $\vec{b}$ is a vector of known constant or function.

9. The recording medium of claim 7, wherein said module for calculating electric potential utilized a linear matrix equation of the form:

$$\overline{A}\vec{\phi}=\vec{b}$$

where $\vec{\phi}$ is a potential vector of M potentials corresponding to each of said nodes in said mesh that are not surface nodes and to each said merged node corresponding to said surface nodes of each said floating conductive pattern; $\overline{A}$ is the matrix of coupling coefficients between said nodes, and $\vec{b}$ is a vector of known constant or function.

10. A method of calculating parasitic capacitance between electrodes of an integrated circuit (IC) having more than two electrodes to which a predetermined voltage is applied and floating conductive patterns are electrically isolated by an insulating layer between the electrodes, comprising the steps of:

dividing an electrode structure having the electrodes, the insulating layer, and the floating conductive patterns into a finite mesh, and defining nodes deposed on said mesh;

obtaining a potential vector using Poisson's equation for each node; and obtaining a parasitic capacitance between the electrodes from the potential vector.

11. The method of claim 10, wherein surface nodes of the floating conductive patterns are contained in each of the nodes.

12. The method of calculating parasitic capacitance according to claim 10, further comprising the step of merging the nodes of the floating conductive patterns into one node by using an equivalent potential condition at the surfaces of the floating conductive patterns.

13. The method of claim 10, wherein said electric potentials are calculated by a linear equation of the form:

$$\overline{A}\vec{\phi}=\vec{b}$$

where $\vec{\phi}$ is a potential vector of N potentials corresponding to each of N said nodes in said mesh; $\overline{A}$ is the matrix of coupling coefficients between said nodes, and $\vec{b}$ is a vector of known constant or function.

* * * * *